United States Patent [19]
Chino et al.

[11] Patent Number: 5,968,845
[45] Date of Patent: Oct. 19, 1999

[54] METHOD FOR ETCHING A COMPOUND SEMICONDUCTOR, A SEMI-CONDUCTOR LASER DEVICE AND METHOD FOR PRODUCING THE SAME

[75] Inventors: Toyoji Chino; Yasuhito Kumabuchi, both of Toyonaka; Isao Kidoguchi, Kawanishi; Hideto Adachi, Ibaraki, all of Japan

[73] Assignee: Matsushita Electric Industrial Co., Ltd., Osaka, Japan

[21] Appl. No.: 08/796,194

[22] Filed: Feb. 7, 1997

[30] Foreign Application Priority Data

Feb. 13, 1996 [JP] Japan .................................. 8-024951

[51] Int. Cl.$^6$ .................................................. H01L 21/20
[52] U.S. Cl. ...................... 438/704; 438/712; 438/714; 438/718; 438/935; 216/63; 216/64; 216/67; 216/69
[58] Field of Search ...................... 438/704, 712, 438/714, 715, 718, 734, 935, 706, 735; 216/63, 64, 67, 69

[56] References Cited

U.S. PATENT DOCUMENTS

| | | | |
|---|---|---|---|
| 4,456,501 | 6/1984 | Bayman | 156/643 |
| 4,874,459 | 10/1989 | Coldren et al. | 156/643 |
| 5,194,119 | 3/1993 | Iwano | 156/643 |
| 5,304,514 | 4/1994 | Nishibe | 437/225 |
| 5,370,767 | 12/1994 | Miyakuni et al. | 156/643 |
| 5,512,331 | 4/1996 | Miyakuni | 427/528 |
| 5,527,425 | 6/1996 | Hobson | 156/643.1 |

FOREIGN PATENT DOCUMENTS

| | | | |
|---|---|---|---|
| 0457049 | 11/1991 | European Pat. Off. | H01L 21/306 |
| 61-136229 | 6/1986 | Japan | H01L 21/302 |
| 1094688 | 4/1989 | Japan | H01S 3/18 |
| 3225303 | 10/1991 | Japan | G02B 6/12 |
| 4100226 | 4/1992 | Japan | H01L 21/302 |
| 6224158 | 8/1994 | Japan | H01L 21/302 |
| 766175 | 3/1995 | Japan . | |

OTHER PUBLICATIONS

S. Miyakuni et al., J. Appl. Phys., vol. 78, No. 9, Nov. 1, 1995, "Low Ion Electron Cyclotron Resonance Etching Of InP Using A $Cl_2/N_3$ Mixture".

Kidoguchi, Isao et al., "650 nm–Band High Power AlGaInP Visible Laser Diodes Fabricated By Reactive Ion Beam Etching Using C12/N2 Mixture", 1996 International Conference on Solid State Devices and Materials (1996) pp. 601–603.

Doussiere, P. et al., "Tapered active stripe for 1.5 $\mu$m InGaAsP/InP Strained Multiple Quantum Well Lasers With Reduced Beam Divergence", Applied Physics Letters, vol. 64, No. 5 (Jan. 31, 1994) pp. 539–541.

Yoshikawa, Takashi et al., "650 nm AlGaInP Visible Light Laser Diode With Dry–Etched Mesa Stripe", Japanese Journal of Applied Physics, vol. 34, Part 1, No. 2B (Feb. 1995) pp. 1273–1278.

Adachi, Hideto et al., "680 nm–Band Self–Sustained Pulsating AlGaInP Visible Laser Diodes", Proceedings of the International Conference on Indium Phosphide and Related Materials, May 9–13, 1995, Conference No. 7 (may 9, 1995) pp. 468–471.

Ren, F. et al., "High Rate Dry Etching Of InGaP in Bcl3 Plasma Chemistries", Applied Physics Letters, vol. 67, No. 17 (Oct. 23, 1995) pp. 2497–2499.

European Search Report for 97102202.5 mailed Mar. 5, 1999.

Primary Examiner—Robert Kunemund
Attorney, Agent, or Firm—Renner, Otto, Boisselle & Sklar, P.L.L.

[57] ABSTRACT

An etching method for performing dry-etching on a III–V group compound semiconductor or a II–VI group compound semiconductor in a dry-etching apparatus comprising a plasma source for creating a plasma of density of about $10^{10}$ cm$^{-3}$ or greater, using a mixed gas containing a gas including a halogen element and a gas including nitrogon. The etching conditions are as follows: (a flow rate of the gas containing said halogen gas)/(a flow rate of said nitrogen gas) $\geq 1$; and an internal pressure during etching reaction is about 1 mTorr or greater.

17 Claims, 13 Drawing Sheets

[110] direction

METHOD FOR ETCHING A COMPOUND SEMICONDUCTOR, A SEMI-CONDUCTOR LASER DEVICE AND METHOD FOR PRODUCING THE SAME

BACKGROUND OF THE INVENTION

1. Field of the Invention

The present invention relates to a compound semiconductor and a method for producing the same. More particularly, the present invention relates to a dry-etching method for a III–V group or II–VI group compound semiconductor, and to a semiconductor laser device fabricated thereby.

2. Description of the Related Art

As a conventional dry-etching technique for a compound semiconductor, a method described in Japanese Laid-Open Patent Publication No. 7-66175 is known in the art. In this method, dry-etching is performed on an In-containing compound semiconductor by using ECR-RIBE (Electron Cyclotron Resonance-Reactive Ion Beam Etching) apparatus with auxiliary coil reducing a divergence of magnetic field. In the ECR-RIBE apparatus, a primary coil and an auxiliary coil are provided so that the divergence of magnetic field in the vicinity of the sample to be etched is inhibited. In this method, chlorine, helium and nitrogen are used as the etching gas. With the flow ratio of the chlorine/nitrogen gases being equal to one or less and the internal pressure being equal to 0.5 mTorr, a cross-section which is vertical with respect to the etching mask and a smooth etching surface are obtained.

According to the above-mentioned publication, when the gas is supplied with the chlorine gas/nitrogen gas ratio being equal to one or less, the production of chlorine radicals is inhibited and the etching due to chlorine ions becomes more predominant over the etching due to chlorine radicals. This makes it possible that ions having energy as low as several tens of eV can be used and a balance of evaporation of a chloride of In and a chloride of P can still be achieved. As a result, etching which is capable of obtaining a cross-section which is vertical with respect to the etching mask, and of obtaining a smooth etching surface can be realized.

Conventionally, the dry-etching of compound semiconductor had problems associated with roughness of the etching surface due to a large difference in vapor pressures between the reactant of a III group element and the etching gas and the reactant of a V group element and the etching gas or with difficulty in controlling cross-sectional shapes.

Dry-etching technology disclosed in the above-mentioned publication also intended to solve these problems. In this technology, nitrogen gas is added so that chlorine gas is decomposed and the amount of chlorine radicals created with chlorine ions is kept below $\frac{1}{3}$ of the total amount of chlorine radicals and chlorine ions, thereby solving the above-mentioned problems. Also realized in the above-mentioned technology is that a pressure inside the reaction chamber is made equal to 0.5 mTorr or less in order to minimize the production of chlorine radicals. This results in desorption velocities in equilibrium of the chloride of In and the chloride of P. A feature of the above-mentioned technology is that the etching is carried out under conditions which minimize the concentration of chlorine radicals. The above-mentioned publication does not show quantitative data concerning the amount of chlorine ions produced and the etching characteristics.

Moreover, if a sample to be etched contains Al, then $Al_2O_3$ is formed with moisture remaining in the reaction chamber, thereby preventing the etching or greatly reducing the etching rate.

SUMMARY OF THE INVENTION

According to one aspect of the present invention, in an etching method for performing dry-etching on a III–V group compound semiconductor or a II–VI group compound semiconductor in a dry-etching apparatus including a plasma source for creating a plasma of density of about $10^{10}$ cm$^{-3}$ or greater, using a mixed gas containing a gas including a halogen element and a gas including nitrogen, (a flow rate of the gas containing the halogen gas)/(a flow rate of the nitrogen gas) ≧about 1, and an internal pressure during etching reaction is about 1 mTorr or greater.

In one embodiment of the present invention, ions created in the plasma source are accelerated, and a sample is etched by kinetic energy of the accelerated ions while a sample surface is being heated.

In one embodiment of the present invention, ions created in the plasma source are accelerated. Only a portion of the sample containing a II–VI group compound in the vicinity of the surface is heated by kinetic energy of the accelerated ions, and a support for the sample is cooled.

In one embodiment of the present invention, etching is performed while a sample holder is heated.

In one embodiment of the present invention, an etching method further includes the steps of: performing a first dry-etching wherein ions created in the plasma source are accelerated by a first accelerating voltage; and performing a second dry-etching, after the first dry-etching, wherein ions created in the plasma source are accelerated by a second accelerating voltage. The second accelerating voltage is larger than the first accelerating voltage.

In one embodiment of the present invention, an etching method further include a step of performing wet-etching.

In one embodiment of the present invention, the dry-etching apparatus includes a radical beam source and an ion beam source, and a density of radicals created in the radical beam source and a density of ions created in the ion beam source are independently controlled.

In one embodiment of the present invention, the compound semiconductor is formed of $Al_xGa_yIn_{1-x-y}P$ ($0<x\leq 1$, $0\leq y\leq 1$).

In one embodiment of the present invention, the compound semiconductor is formed above an off-substrate.

According to another aspect of the present invention, an etching method for performing dry-etching on a III–V group compound semiconductor or a II–VI group compound semiconductor in a dry-etching apparatus including a plasma source for creating a plasma of density of about $10^{10}$ cm$^{-3}$ or greater, using a mixed gas containing a gas including halogen element and a gas including nitrogen, includes the steps of: performing a first dry-etching with a halogen ion density being made larger than a halogen radical density; and performing a second dry-etching with a halogen ion density being made smaller than a halogen radical density.

According to yet another aspect of the present invention, an etching apparatus includes a radical beam source, an ion beam source, a reaction chamber having the radical beam source and the ion beam source connected thereto, a sample support provided inside the reaction chamber and a load lock chamber.

According to still another aspect of the present invention, a method for producing a semiconductor laser device includes the steps of: epitaxially growing at least one compound semiconductor layer on a semiconductor substrate; forming a patterned mask on the at least one compound semiconductor layer; performing etching on the at least one compound semiconductor layer, using the patterned mask, by any one of the etching methods described above so as to form a ridge stripe; and burying the ridge stripe with compound semiconductor.

In one embodiment of the present invention, the substrate is a misoriented substrate; the at least one compound semiconductor layer includes an active layer, an n-AlGaInP cladding layer and p-AlGaInP cladding layer, the n-AlGaInP cladding layer and the p-AlGaInP cladding layer interposing the active layer; and the ridge stripe contains the p-AlGaInP layer.

In one embodiment of the present invention, the p-AlGaInP cladding layer has a p-AlGaInP first cladding layer and a p-AlGaInP second cladding layer, and an etching stopper layer is formed between the first cladding layer and the second cladding layer.

In one embodiment of the present invention, a layer for monitoring an etched amount of the p-AlGaInP second cladding layer is formed within the p-AlGaInP second cladding layer.

According to still another aspect of the present invention, a semiconductor laser device includes: a substrate; and a ridge stripe formed on the substrate and including an active layer, an n-cladding layer and p-cladding layer, the n-cladding layer and the p-cladding layer interposing the active layer. The ridge stripe has a laser unit which lases and a tip portion having a tapered shape. An angle formed inside the ridge stripe by a bottom surface of the ridge stripe and a side surface of the ridge stripe is in the range of about 60° and about 90°.

According to still another aspect of the present invention, a semiconductor laser device includes: a misoriented substrate; and an n-AlGaInP cladding layer, an active layer and p-AlGaInP cladding layer which are formed above the substrate. The p-AlGaInP cladding layer has a ridge structure having a substantially symmetrical shape, and current blocking layers are formed on both sides of the ridge structure.

In one embodiment of the present invention, the p-AlGaInP cladding layer has a p-AlGaInP first cladding layer, a p-AlGaInP second cladding layer and an etching stopper layer formed between said first cladding layer and said second cladding layer.

In one embodiment of the present invention, a layer for monitoring an etched amount of the p-AlGaInP second cladding layer is formed within the p-AlGaInP second cladding layer.

In one embodiment of the present invention, the tapered shape is such that the width of the tip portion is narrower than that of the laser unit, and a width of a tip of the tip portion is about 1 $\mu$m or less.

In one embodiment of the present invention, the tapered shape is such that the width of the tip portion is wider than that of the laser unit.

Thus, the invention described herein makes possible the advantages of (1) providing a dry-etching method which is performed on a III–V group and II–VI group compound semiconductors and, furthermore, on a III–V group compound semiconductor containing Al by using a chlorine gas added with a nitrogen gas, and is capable of obtaining a vertical cross-section and a smooth etching surface without reducing the production amount of chlorine gas radicals, and of (2) providing a semiconductor laser device fabricated by using this dry-etching method and a production method thereof.

These and other advantages of the present invention will become apparent to those skilled in the art upon reading and understanding the following detailed description with reference to the accompanying figures.

DESCRIPTION OF THE PREFERRED EMBODIMENTS

Hereinafter, preferred embodiments of the present invention will be described in detail.

(EXAMPLE 1)

As a first embodiment of dry-etching according to the present invention, dry-etching on a III–V group compound semiconductor will be described. A sample to be etched is InP, and a chlorine gas and a nitrogen gas are used as the etching gases.

Figure 1:
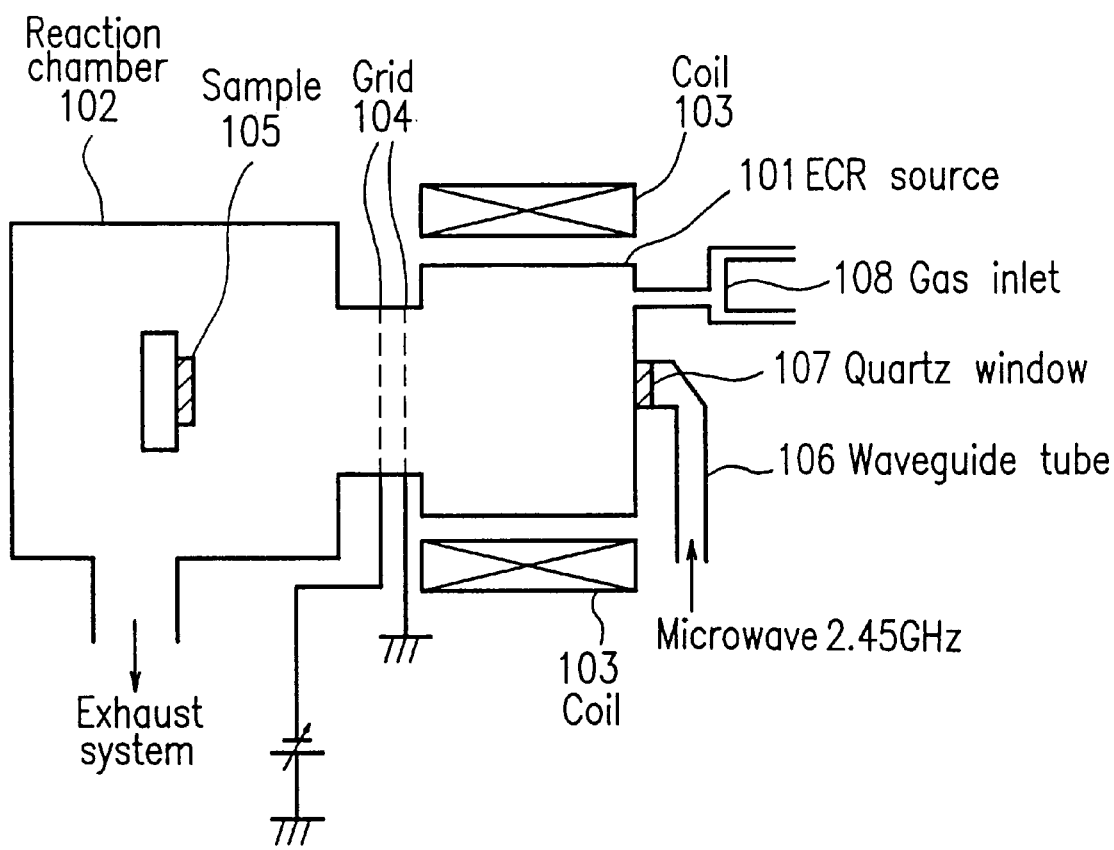
FIG. 1 is a schematic view of an ECR-RIBE (Electron Cyclotron Resonance-Reactive Ion Beam Etching) apparatus.

FIG. 1 schematically illustrates the construction of an ECR-RIBE apparatus (Electron Cyclotron Resonance-Reactive Ion Beam Etching apparatus; hereinafter, referred to as an ECR-RIBE apparatus) which is used in the present embodiment. In this apparatus, the sample to be etched is positioned outside of coils which generate a magnetic field.

As illustrated in FIG. 1, the ECR-RIBE apparatus includes an ECR source 101, a reaction chamber 102 which accommodates the sample and is connected to the ECR source 101, and an exhaust pump system (not shown in the figure). The ECR source 101 generates ions or radicals. A chlorine gas and a nitrogen gas whose flow rates are placed under control are introduced into the ECR source 101 through a gas inlet 108. Furthermore, a microwave of 2.45 GHz is guided into the ECR source 101 through a waveguide tube 106 toward a quartz window 107 so that the chlorine gas and the nitrogen gas become exited. Electrons resonate due to the magnetic field of 875 gausses generated by the coils 103, and engage in circular motion thereby repeating collisions with the gas molecules. Chlorine ions and nitrogen ions thus created in the ECR source 101 are accelerated by a grid 104, and are radiated onto the sample 105.

Although the chlorine ions and the nitrogen ions are accelerated and radiated onto the sample 105, since the chlorine radicals and the nitrogen radicals created in the ECR source 101 are not ionized, they are not accelerated. However, the chlorine radicals and the nitrogen radicals reach the surface of the sample 105 by diffusion, and contribute to the etching. This ECR-RIBE apparatus differs from an ECR-RIBE apparatus with auxiliary coil reducing a divergence of magnetic field in that the coils 103 are not provided on the side of the reaction chamber 102. For this reason, a magnetic field generated by the coils 103 is a diverging magnetic field.

Ions and radicals created as described above reach the surface of the sample 105, and react with InP of which the sample is made to yield an In chloride and a P chloride. The boiling point of a P chloride is low, and it is readily vaporized. For example, the boiling point is 76° C. for $PCl_3$ and 162° C. for $PCl_5$.

On the other hand, the boiling point of an In chloride is high, and it takes effort to vaporize it. For example, the boiling point is 560° C. for $InCl_2$ and 600° C. for $InCl_3$. Therefore, a layer of In chloride is formed on the surface of the sample 105. Since the vaporization of In chloride is facilitated by collisions of the accelerated chlorine and nitrogen ions from the ECR source 101 onto the surface of the sample 105, an acceleration voltage for the ions is an important factor. At 300 V or below, the In chloride is not vaporized, and the sample is not etched.

Table 1 shows etching conditions for the present embodiment.

Under the conditions shown in Table 1, the etching yields the optimum result with the acceleration voltage equal to about 300 V or above. A mask used in the above etching is made of $SiO_2$.

Hereinafter, results of the dry-etching performed under the conditions shown in Table 1 will be described.

As an experiment, dry-etching was performed with a chlorine flow rate being about 10 SCCM, an acceleration voltage being about 650 V, an internal pressure during reaction being about 2.5 mTorr and a sample temperature being about 200° C., while a nitrogen flow rate is varied. The evaporation of a III group compound can be facilitated by heating a sample support and keeping a sample temperature at about 200° C.

Figure 2A:
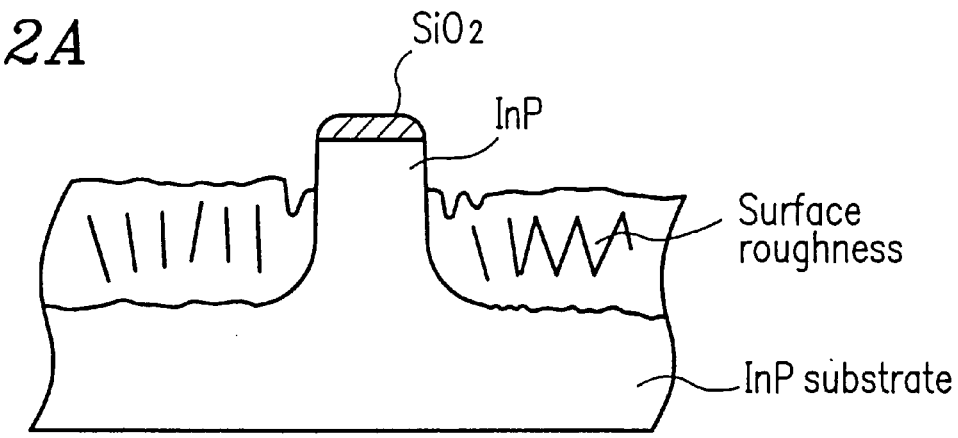
FIGS. 2A and 2B are cross-sectional views of InP after the dry-etching according to one embodiment of the present invention.
Figure 2B:
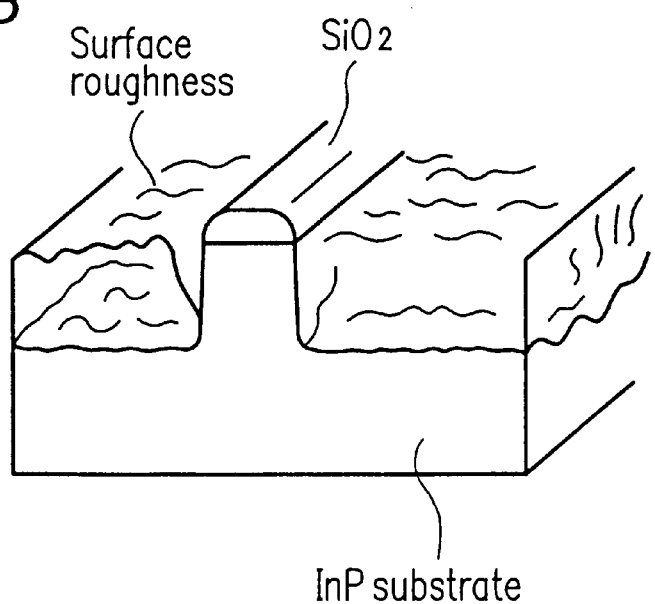
Figure 3:
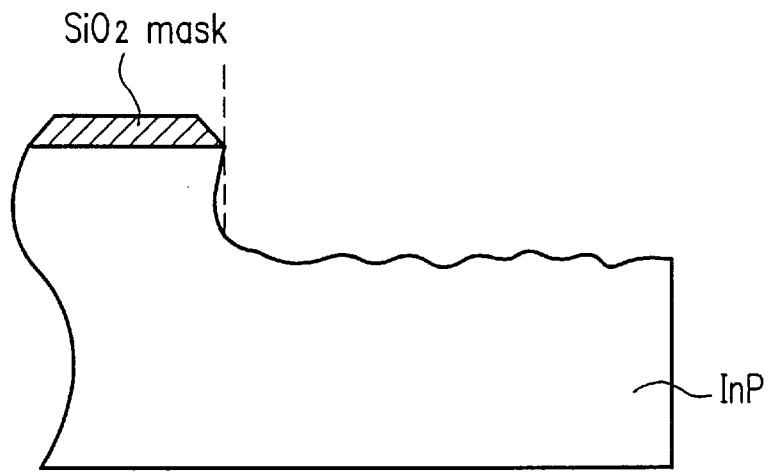
FIG. 3 is a cross-sectional view of InP after the dry-etching according to one embodiment of the present invention.
Figure 4:
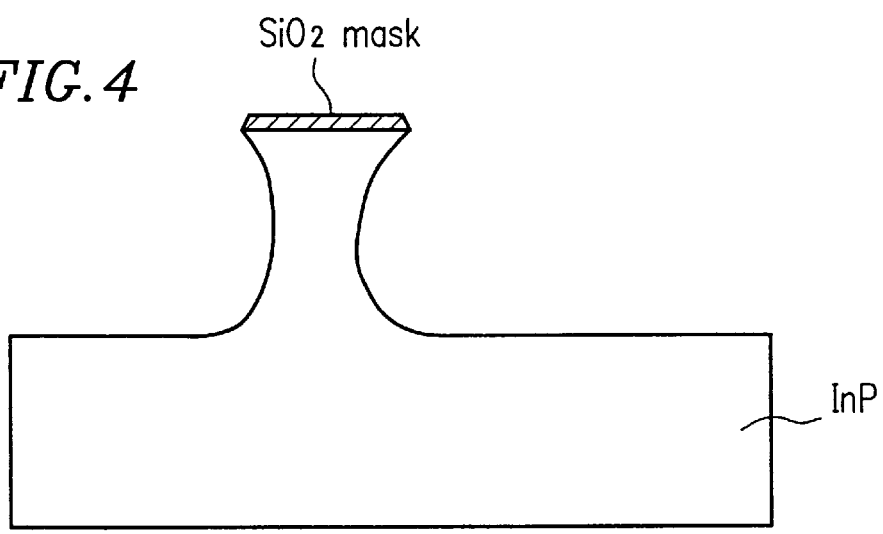
FIG. 4 is a cross-sectional view of InP after the dry-etching according to one embodiment of the present invention.

FIGS. 2A, 2B, 3 and 4 schematically illustrate cross-sections of InP performed with dry-etching. FIGS. 2A, 3 and 4 correspond to the nitrogen flow rates of about 35 SCCM, about 7 SCCM and about 3.5 SCCM, respectively. As can be seen from these figures, although a part of InP is etched away, the bottom surface (etching surface) comes out to be extremely rough. FIG. 2B is a perspective view of FIG. 2A. FIG. 2B also shows that the bottom surface is rough. In FIG. 3, the sample is etched in a substantially perpendicular direction with respect to the $SiO_2$ mask, and the surface roughness almost disappears. In FIG. 4, there is no surface roughness, and the etching surface is smooth. However, side-etching where a portion under the mask is also etched away occurs, and the sample is not etched in the perpendicular direction with respect to the mask.

From the above results, there seems to be a boundary of whether or not the etching surface becomes rough between the chlorine/nitrogen flow rate ratio of about 0.29 and about 1.43. By conducting experiments, it was determined that the boundary of the chlorine/nitrogen flow rate ratio was in the vicinity of about 1.0. Also found was that the best smoothness of the etching surface was obtained when the chlorine/nitrogen flow rate ratio was in the vicinity of about 2.85.

However, the cross-section illustrated in FIG. 4 does not have vertical sides, showing that substantial side-etching occurred. Therefore, in order to obtain vertical sides, it is necessary to reduce chemical reaction components during the dry-etching. Then, dry-etching was performed with the sample temperature being reduced to about 100° C. The remaining conditions other than temperature were the same as in the case of FIG. 4. The result is illustrated in FIG. 5.

By reducing the sample temperature to 100° C., a sputtering component becomes stronger than a chemical reaction component, and the $SiO_2$ mask retreats to the substrate side by etching. This results in over-etching, and the cross-sectional shape becomes trapezoidal. However, since the etching surface is very smooth, no practical difficulty arises with the trapezoidal cross-section.

Figure 5:
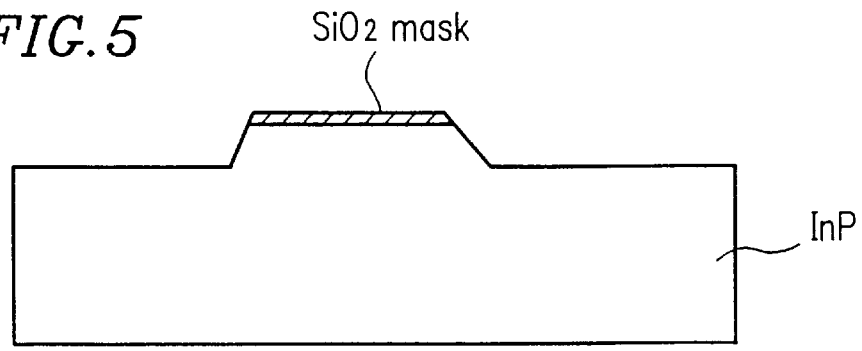
FIG. 5 is a cross-sectional view of InP after the dry-etching according to one embodiment of the present invention.

As can be seen from FIGS. 4 and 5, when the chemical reaction component is predominant over the sputtering method in etching, the side-etching occurs. When the sput-

TABLE 1

| Chlorine | Nitrogen | Microwave power | Accelerating voltage | Internal pressure | Sample temperature |
|---|---|---|---|---|---|
| 3~20 SCCM | 3.5~35 SCCM | 200W (Fixed) | 300~900 V | 0.5~2.5 mTorr | Room temperature –300° C. | tering component is predominant over the chemical reaction component, the mask retreats and over-etching results.

Next, etching conditions for obtaining vertical sides in a cross-section will be considered, and the result thereof will be described.

Figure 6:
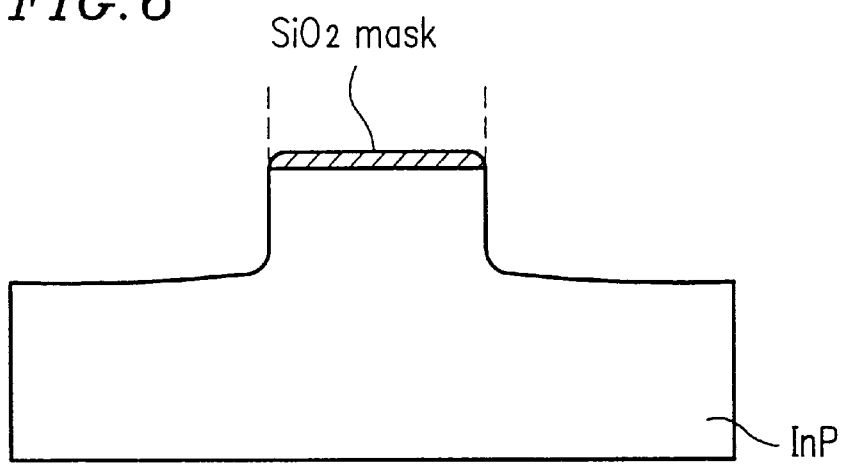
FIG. 6 is a cross-sectional view of InP after the dry-etching according to one embodiment of the present invention.

The etching was performed with a sample temperature being about 150° C. so as to increase the chemical reaction component, and with a supply of chlorine being increased up to about 11.5 SCCM so as to improve the etching rate (the nitrogen flow rate is 3.5 SCCM, which is the same as in FIG. 4). The result is illustrated in FIG. 6. As can be seen from FIG. 6, the sputtering component and the chemical reaction component are properly balanced, and a cross-section having vertical sides is realized. In this case, the acceleration voltage is kept at about 650 V, and the internal pressure is kept at about 2.5 mTorr.

The etching conditions for each of the cases illustrated in FIGS. 2A and 2B, 3, 4, 5 and 6 are shown in Table 2.

Figure 16:
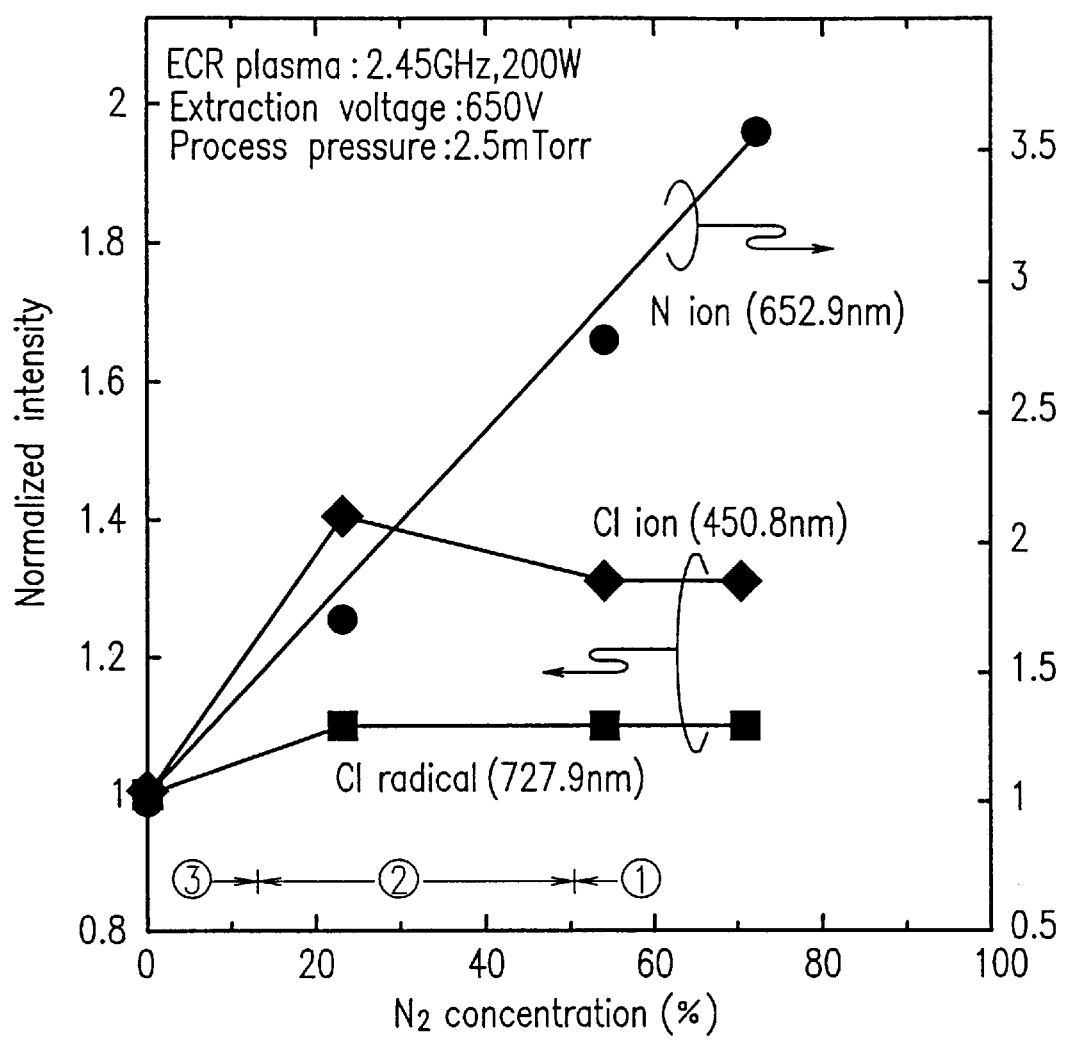
FIG. 16 is a graph showing a result of optical emission spectroscopy of plasma.

A case where the chlorine/nitrogen flow rate ratio is less than 1 corresponds to a portion of FIG. 16 where the nitrogen concentration exceeds 50% (region ①). In region ①, although the chlorine ion intensity is about 1.3 times the value with pure chlorine (no nitrogen added), the nitrogen ion intensity is about 3 times the value with pure chlorine. That is, due to excessive nitrogen ions, the P chloride, which has a vapor pressure higher than the In chloride, are considered to be selectively sputtered, thereby making the etching surface rough.

A case where the chlorine/nitrogen flow rate ratio is between about 1 and about 6.4 corresponds to a portion of FIG. 16 where the nitrogen concentration is between about 13% to about 50% (region ②). In this region, the nitrogen ion intensity has not increased very much. The desorption from the surfaces of In chloride and P chloride are properly balanced, thereby realizing a smooth etching surface.

A case where the chlorine/nitrogen flow rate ratio exceeds 6.4 corresponds to a portion of FIG. 16 where the nitrogen

TABLE 2

|  | Chlorine (SCCM) | Nitrogen (SCCM) | Chlorine/Nitrogen flow rate ratio | Accelerating voltage (V) | Internal pressure (mTorr) | Sample temperature (° C.) |
|---|---|---|---|---|---|---|
| FIG. 2A,2B | 10 | 35 | 0.29 | 650 | 2.5 | 200 |
| FIG. 3 | 10 | 7 | 1.43 | 650 | 2.5 | 200 |
| FIG. 4 | 10 | 3.5 | 2.8 | 650 | 2.5 | 200 |
| FIG. 5 | 10 | 3.5 | 2.8 | 650 | 2.5 | 100 |
| FIG. 6 | 11.5 | 3.5 | 3.29 | 650 | 2.5 | 150 |

If the chlorine/nitrogen flow rate ratio is equal to about 1 or greater, then the etching surface does not become rough. However, if this flow rate ratio is made equal to or greater than 6.4, then the etching surface starts to become rough again. Taking the roughness of etching surface into consideration, the optimum value for the chlorine/nitrogen flow rate ratio is in the range of about 1.0 to about 6.4.

FIG. 16 shows a result of optical emission spectroscopy of plasma. This spectroscopic result shows changes in intensities of nitrogen ions, chlorine ions and chlorine radicals with respect to the nitrogen concentration. Each of the optical emission intensities shown in FIG. 16 is normalized with the optical emission intensity of plasma of a chlorine gas only. Optical emission is observed at 652 nm for the nitrogen ions, 450.8 nm for the chlorine ions and 727.9 nm for the chlorine radicals. Optical emission at 652.9 nm in the case of chlorine gas only is a noise, not the optical emission due to the nitrogen ions.

The optical emission intensity of nitrogen ions monotonically increases as the added amount of nitrogen increases. Although the optical emission intensity of chlorine ions increases with the addition of nitrogen, it reaches the maximum value when the added concentration of nitrogen becomes about 23%. This maximum value is about 1.4 times the value with no nitrogen being added. Then, the optical emission intensity slightly decreases as the added concentration of nitrogen increases, and becomes saturated at the value about 1.3 times the value with no nitrogen being added. The optical emission intensity of chlorine radicals increases by about 10% when the nitrogen is added, but becomes saturated at this value. Further addition of nitrogen does not result in any increase of the optical emission intensity.

Hereinafter, changes in the above-described optical emission intensities will be described in comparison with etching characteristics.

concentration is less than about 13% (region ③). In region ③, the etching surface becomes rough again. The reason is considered to be as follows. Since the desorption of In chloride and P chloride which are generated occurs mainly due to thermal energy rather than the sputtering effect, selective desorption of the P chloride occurs.

As described above, a substantial feature of the present invention is that the effect of adding the nitrogen gas is not only to facilitate the creation of chlorine ions but also to facilitate the desorption of III group or V group chlorides because of the sputtering effect of the nitrogen ions themselves. This is also true when the present invention is applied to a II–VI group compound semiconductor.

Although, in the above description, InP which is a III–V group compound semiconductor is used as a sample to be etched, a compound semiconductor of AlGaInP type or AlGaInN type, or a II–VI group compound semiconductor of ZnMgSSe type can also be used in place of the InP as described below. Moreover, the etching can be performed with the substrate being kept at a room temperature although the etching rate decreases.

(EXAMPLE 2)

Hereinafter, a dry-etching method for a III–V group compound semiconductor will be described as a second embodiment of the dry-etching method according to the present invention. Specifically, in this dry-etching method, only a sample surface is heated for etching by kinetic energy of accelerated ions without raising a temperature of the overall sample.

In the present example, InP is used as an etching sample, and $SiO_2$ is used as an etching mask. The method described in this example can be applied to an etching of a II–VI group compound semiconductor.

As described in the above Example 1, if a sample temperature is raised, then the chemical reaction component during dry-etching becomes predominant over the sputtering component, and the side-etching occurs where a portion under the mask is also etched away. However, if the sample temperature is lowered, then the sputtering component becomes strong, and the over-etching where the mask retreats occurs or the etching surface becomes rough.

Accordingly, in the present embodiment, the sample is closely attached to a sample holding jig fixture made of Al, and the etching is performed while this jig fixture is being cooled.

Ions created in the ECR source are accelerated by the grid with the voltage of several hundreds V. The ions which have thus acquired kinetic energy are then radiated onto the sample. Radicals created in the ECR source are not accelerated. Although energy for one radical is as small as 20 to 30 eV, since the number of radicals created is large, the total energy received by the sample surface from the radicals are substantially large. Since the sample surface receives energy of a number of ions and radicals as described above, the same effect as heating the sample itself to a temperature of several hundreds degrees Celsius is obtained without actually raising the temperature of the sample. That is, by heating the surface of the sample as such, evaporation of a III group or II group chloride is facilitated, thereby improving the etching rate.

Figure 8:
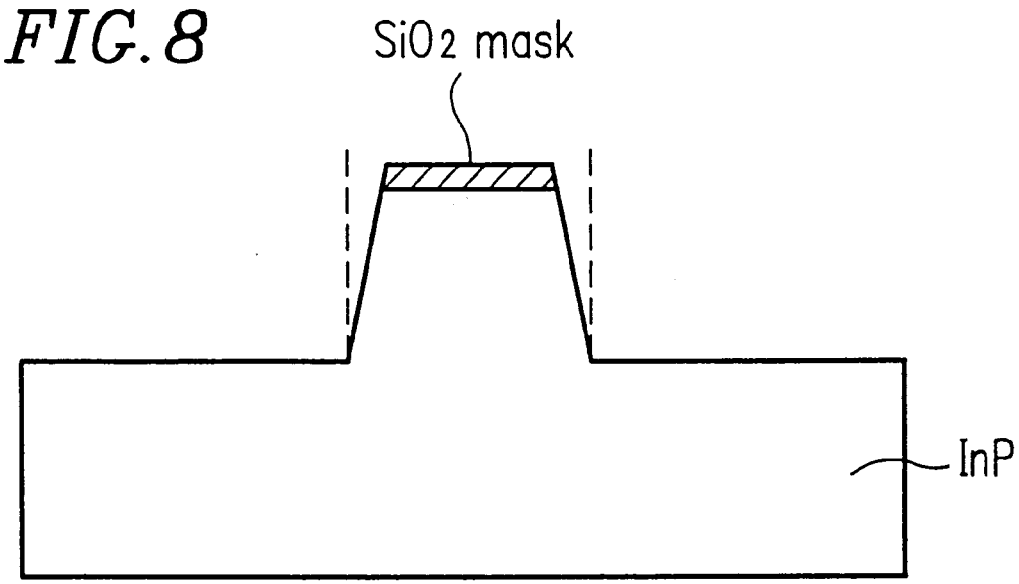
FIG. 8 is a cross-sectional view of InP after the dry-etching according to one embodiment of the present invention.

FIG. 8 illustrates a cross-section of the InP sample when dry-etching is performed on the sample by using an ECR-RIBE apparatus, with the chlorine flow rate being about 11.5 SCCM, the nitrogen flow rate being about 3.5 SCCM, the microwave power being about 200 W, the internal pressure being about 2.5 mTorr and the acceleration voltage being about 650 V.

In this dry-etching, the sample is not heated as a whole. The sample is held by a sample holding jig fixture made of Al, which is mounted on a liquid-cooled sample support. Because of this construction, only a portion of the sample in the vicinity of the surface is heated while the temperature in other portions does not increase, thereby protecting the sample from thermal damage. Doing so is particularly effective in etching a sample including a II–VI group compound because the crystal growth temperature of a II–VI group compound semiconductor is low (about 260° C.) and it is therefore necessary to keep the etching temperature lower than the crystal growth temperature (about 250° C. or less) in order to prevent the crystallinity of the sample from deteriorating.

As described in the above Example 1, the shape of the cross-section of the etched sample reflects a balance of the sputtering component and the chemical reaction component during etching. That is, if the sputtering component is predominant, then the sample is over-etched, and if the chemical reaction component is predominant, then side-etching results.

As can be seen from FIG. 8, according to the present embodiment, the cross-section of the sample has substantially vertical sides, indicating a proper balance of the sputtering component and the chemical reaction component, although the overall temperature of the sample is around room temperature. The cross-section shown in FIG. 8 has substantially the same cross-sectional shape as in the case where etching is performed with the sample temperature being set at about 150° C., i.e., as in the case shown in FIG. 6. That is, as far as a cross-sectional shape is concerned, the result shown in FIG. 8 where etching is performed without heating the sample is the same as the result shown in FIG. 6 where etching is performed with the sample temperature being set at about 150° C. The etching rate in the case of FIG. 8, however, is lower than that in the case of FIG. 6 by about 25%.

In the present embodiment, although the sample temperature is set around room temperature, it is also possible to reduce the difference in the degree of sublimation between a V group chloride and a III group chloride by cooling the sample support to 0° C. or below such that the sublimation of the V group chloride is inhibited. This makes it possible to perform dry-etching which is capable of obtaining a sample having a cross-section with vertical sides and a smooth etching surface.

(EXAMPLE 3)

As a third embodiment of a dry-etching according to the present invention, a dry-etching on a III–V group compound semiconductor will be described. Specifically, a dry-etching where double-stage etching with differing conditions is performed will be described. In this etching, InP and $SiO_2$ are used as a sample and an etching mask, respectively, and chlorine and nitrogen are used as an etching gas.

First dry-etching is performed by using an ECR-RIBE apparatus. In this first dry-etching, the internal pressure is set at about 1 mTorr or less and the acceleration voltage is set at about 300 V or greater so that collisions among gas molecules are inhibited, thereby making the ion density larger than the radical density. The chlorine/nitrogen flow rate ratio is set at about 1 or greater, and the sample temperature is set at about 100° C. In this dry-etching, etching due to the sputtering component becomes predominant over etching due to the chemical reaction component, and fast dry-etching proceeds in the direction perpendicular to the sample surface, thereby forming a shape close to a desired shape.

The above-described first dry-etching has a relatively high etching rate of about 1000 Å/minute. When etching is performed at high speed, a defect may result on the etching surface including the side and bottom surfaces, or the etching surface may become rough. This is because halogen ions created in the ECR source are accelerated by high voltages of 300 V or greater, and are radiated onto the sample, thereby creating a crystalline defect in the sample. It is also because, since the boiling point of a halogen compound differs for a III group (or II group) and a V group (VI group), the stoichiometry becomes misaligned at the etching surface, resulting in a larger amount of the III group (or II group) element than the V group (or VI group) element at the etching surface.

Next, following the first dry-etching, a second dry-etching is performed. One purpose of the second dry-etching is to remove a layer including fabrication-induced damage occurred during the first dry-etching. It is also a purpose of the second dry-etching to remove surface roughness from the etching surface in order to obtain a smooth surface in the event such surface roughness has resulted on the etching surface. In order to achieve the above goals, the second dry-etching is performed with the chlorine/nitrogen flow rate ratio being set at about 3 or greater, the internal pressure at about 2 mTorr or greater, the acceleration voltage at about 300 V or less and the sample temperature at about 200° C. In this dry-etching, the number of collisions among gas molecules increases, and the radical density becomes larger than the ion density. Furthermore, since the mean free path becomes short, the chemical reaction component acts stronger than the sputtering component.

In the above-described dry-etching under conditions for stronger chemical reaction component, since the fabrication-induced damage to the crystals is small, a layer including many fabrication-induced damages can be removed in the first etching. If the surface roughness occurs on the etching surface in the first dry-etching, the etching surface including the surface roughness can be smoothed.

The first dry-etching can be performed with the following conditions: chlorine/nitrogen flow rate ratio≧about 1; internal pressure≦about 1 mTorr; and acceleration voltage≧about 300 V. However, the following is preferable for the optimum conditions: chlorine flow rate/nitrogen flow rate≧about 3; internal pressure≦about 0.5 mTorr; and acceleration voltage≧about 600 V.

The second dry-etching can be performed with the following conditions: chlorine/nitrogen flow rate ratio≧about 3; internal pressure≧about 2 mTorr; and acceleration voltage≦about 300 V. However, the following is preferable for the optimum conditions: chlorine flow rate/nitrogen flow rate≧about 10; internal pressure≧about 3 mTorr; and acceleration voltage≦about 100 V.

Figure 12A:
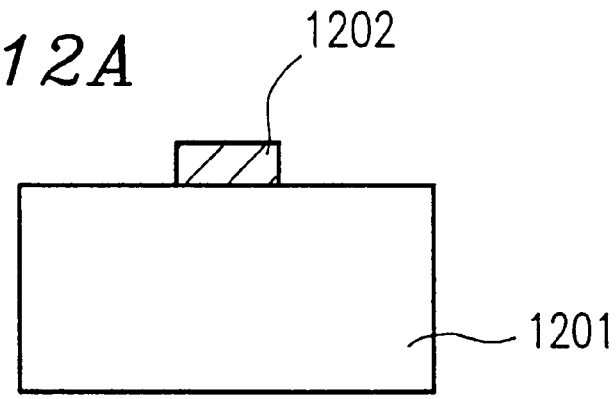
FIG. 12A, 12B and 12C are cross-sectional views illustrating a double stage dry-etching including different conditions according to one embodiment of the present invention.
Figure 12B:
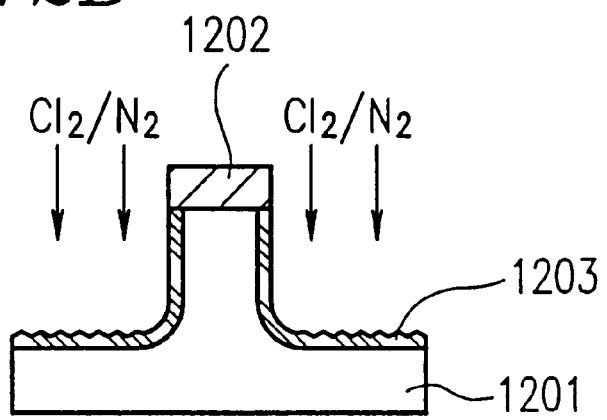
Figure 12C:
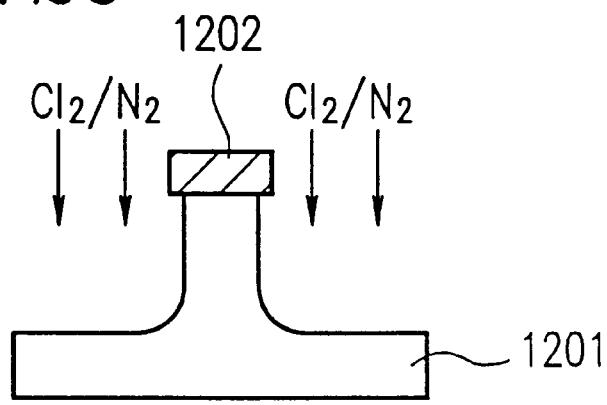

FIGS. 12A, 12B and 12C are cross-sectional views illustrating the steps of dry-etching according to the present embodiment. First, as illustrated in FIG. 12A, a patterned $SiO_2$ mask 1202 is formed on an InP substrate 1201. Then, as illustrated in FIG. 12B, the first dry-etching is performed. This first dry-etching creates a damaged layer 1203 induced by the fabrication on the etching surface. Next, as illustrated in FIG. 12C, the second dry-etching is performed. In the second dry-etching, the chlorine ion density is smaller and the chlorine radical density is larger than in the first dry-etching. By performing the second dry-etching, the damaged layer 1203 induced by the fabrication is removed, and a smooth etching surface including sides perpendicular to the mask 1202 can be formed.

In the above description, relative magnitudes of the chlorine ion density and the chlorine radical density with respect to each other during the first dry-etching and the second dry-etching are varied by changing the internal pressure, the flow rate and the acceleration voltage. Alternatively, the first dry-etching and the second dry-etching can be performed with only the acceleration voltage being varied. That is, while the conditions, namely the chlorine/nitrogen flow rate ratio≧about 3, the internal pressure≧about 2 mTorr and the sample temperature at about 200° C., are applied to both the first dry-etching and the second dry-etching, the acceleration voltage is set at about 900 V for the first dry-etching and at about 100 V for the second dry-etching. Even with dry-etching under such conditions, an etching surface which has no roughness can be realized.

(EXAMPLE 4)

Hereinafter, etching on a III–V group compound semiconductor will be described as a fourth embodiment of an etching method according to the present invention. Specifically, an etching method where double-stage etching including dry-etching and wet-etching is performed will be described. In this etching, InP and $SiO_2$ are used as a sample and an etching mask, respectively, and chlorine and nitrogen are used as an etching gas. As an etchant for the wet-etching, hydrochloric acid, acetic acid and hydrogen peroxide are used.

First, the first etching (dry-etching) will be performed by using an ECR-RIBE apparatus. This first etching is performed under following conditions: the chlorine flow rate/nitrogen flow rate≧about 1; the internal pressure is greater than about 2 mTorr; the acceleration voltage is greater than about 300 V; and the sample temperature is greater than about 100° C. Although it is possible to perform the first etching under the above conditions, the optimum conditions are as follows: the chlorine flow rate is about 11.5 SCCM; the nitrogen flow rate is about 3.5 SCCM; the sample temperature is about 150° C; the acceleration voltage is about 650 V; and the internal pressure is about 2.5 mTorr. The sample can be fabricated into a predetermined shape under the above conditions. A layer with a fabrication-induced damage which is created in the first etching is removed by the second etching, which will be described in the following.

Figure 7:
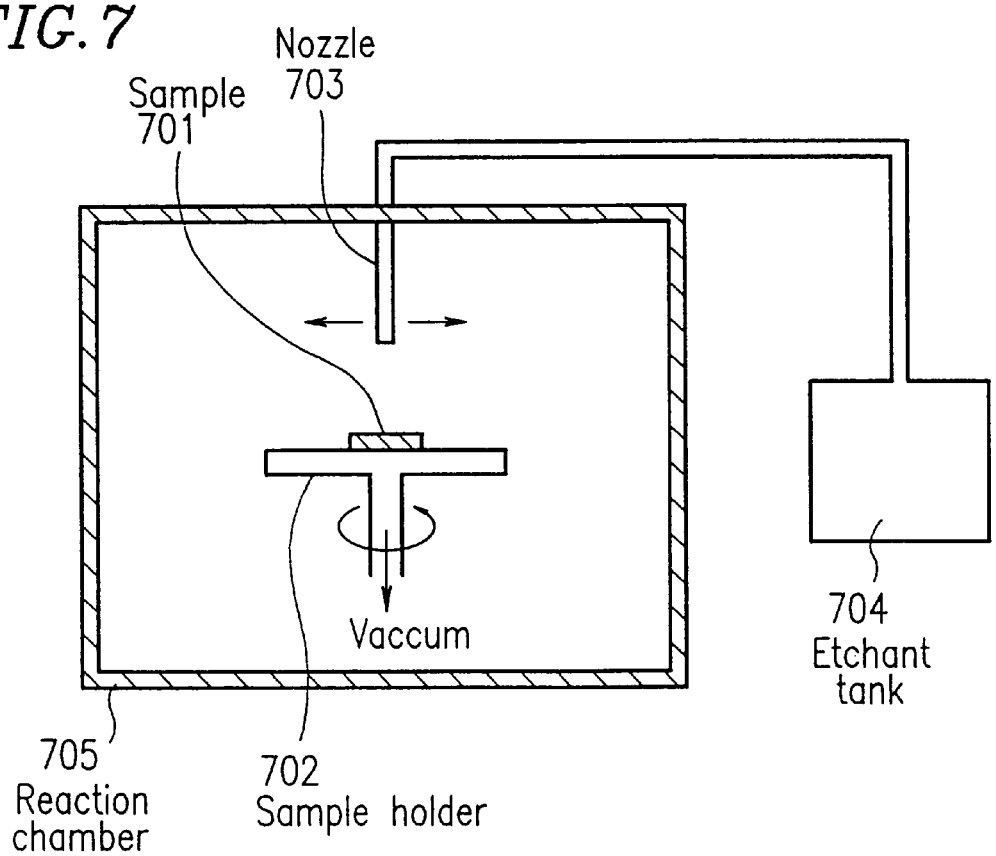
FIG. 7 is a structural cross-sectional view of a spin-etching apparatus for uniformly performing wet-etching while rotating the substrate.

FIG. 7 schematically illustrates a structure of a spin-etching apparatus used in the second etching. The second etching, that is, the wet-etching is performed inside a reaction chamber 705. The sample 701 which was subjected to the above dry-etching is placed on a sample holder 702. The sample holder 702 holds the sample 701 by a vacuum chuck and rotates at a predetermined rate of rotation. A mixture of hydrochloric acid, acetic acid and hydrogen peroxide, which is stored in an etchant tank 704 and is kept at a predetermined temperature, is discharged through a nozzle 703 and falls onto the sample 701. The nozzle 703 makes a reciprocating motion of predetermined distance in the radial direction passing through the center of the sample holder 702. The reciprocating motion of the nozzle 703 in the radial direction, which drops the etchant onto the rotating sample 701, allows extremely uniform wet-etching to be performed. Accordingly, the damaged layer induced by the fabrication created in the first etching is removed. The mixing ratio of the hydrochloric acid, the acetic acid and the hydrogen peroxide is 3:36:1, and the temperature of the mixture is kept at about 20° C.

Since the wet-etching does not include sputtering component, even a small damage which is created by dry-etching can be prevented by using the wet-etching. This improves the smoothness of the etching surface.

Although, in the present embodiment, the mixture of hydrochloric acid, acetic acid and hydrogen peroxide is used as the etchant for the second etching, a mixture of sulfuric acid, hydrogen peroxide and water, a mixture of hydrochloric acid and phosphoric acid, or a mixture of saturated bromine water and methanol can alternatively be used as the etchant as long as the etchant is capable of removing the damaged layer induced by the fabrication created in the first etching.

(EXAMPLE 5)

Hereinafter, in addition to the ECR source, a dry-etching apparatus including a radical beam source and an ion beam source and a method of dry-etching using this dry-etching apparatus will be described.

Figure 9:
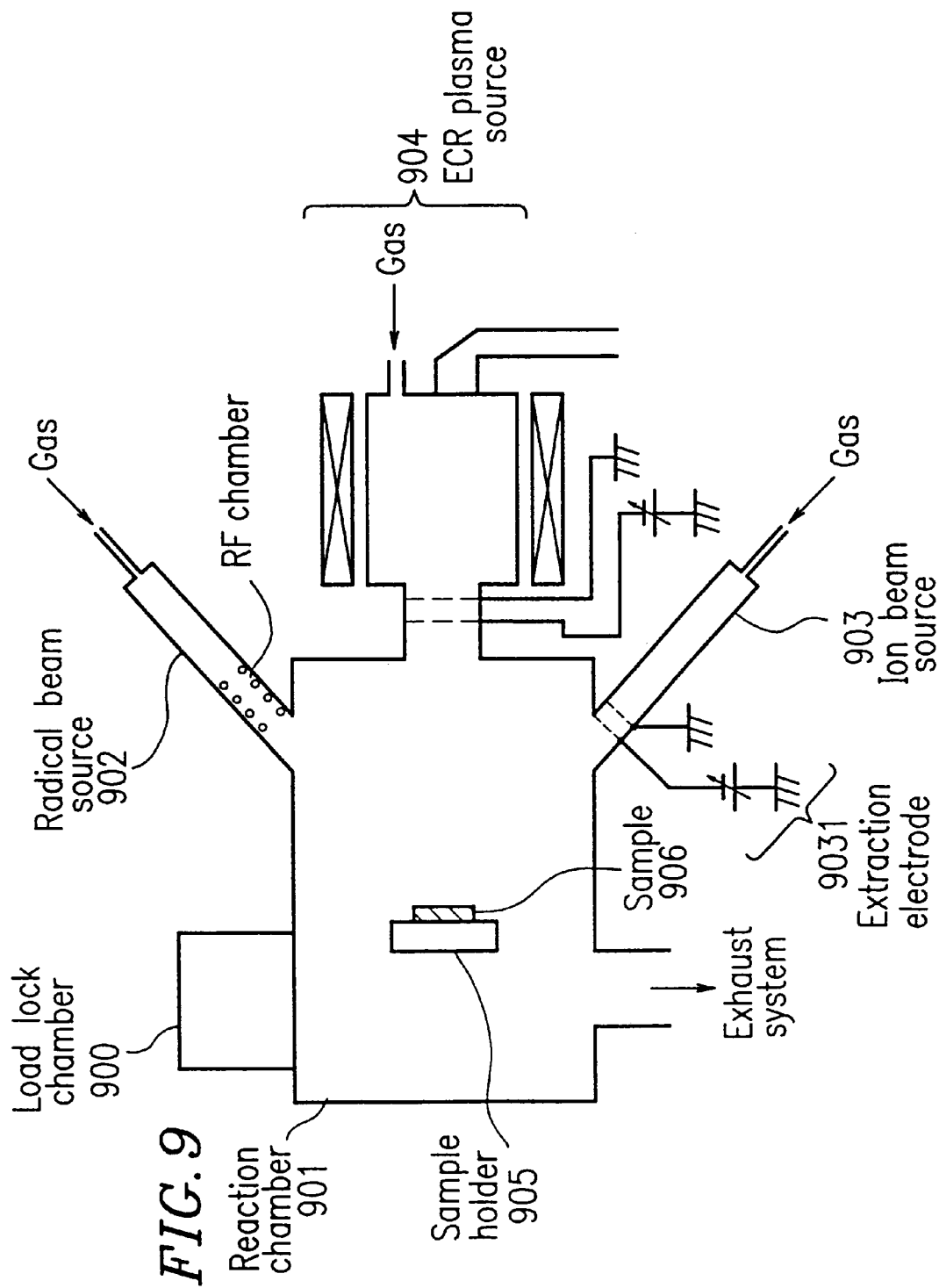
FIG. 9 is a structural cross-sectional view of a dry-etching apparatus including a radical beam source, an ion beam source and an ECR source.

FIG. 9 schematically illustrates a structure of a dry-etching apparatus of the present embodiment. This apparatus includes a radical beam source 902 and an ion beam source 903 in addition to the ECR source 904 and the reaction chamber 901. The radical beam source 902 and the ion beam source 903 are connected to the reaction chamber 901.

The reaction chamber 901 includes therein a sample holder 905 which holds a sample 906. Chlorine radicals produced in the radical beam source 902; chlorine ions produced in the ion beam source 903; and chlorine ions, chlorine radicals and nitrogen ions produced in the ECR source 904 are radiated onto the sample. The sample 906 is transferred from a load lock chamber 900, which is intended for a transfer of the sample 906 to the reaction chamber 901, to the reaction chamber 901. An exhaust system (not shown in the figure) is maintained at about $10^{-6}$ Torr or less.

In the radical beam source 902, a RF high frequency wave is added to the chlorine gas which then becomes a plasma. This produces the chlorine ions and the chlorine radicals. Since the chlorine ions have a mean free path of several cm when not accelerated, they collide with other atoms and electrons inside the radical source 902 or the reaction chamber 901, and become annihilated. Therefore, the chlorine ions do not reach the sample. The produced radicals reach the surface of the sample by diffusion, and contribute to reaction.

Similarly, a RF high frequency wave is added to the chlorine gas inside the ion beam source 903 which then becomes a plasma. This produces the chlorine ions and the chlorine radicals. By changing voltage applied to an extraction electrode 9031, a ratio of chlorine ions and chlorine radicals drawn from the ion beam source 903 can be changed. This is done such that the chlorine ions are drawn in an amount larger than the chlorine radicals so as to be radiated onto the sample surface.

As described in Example 1, the gas is decomposed and ions and radicals are produced inside the ECR source 904. In this example, a nitrogen gas is introduced into the ECR source 904.

By including the ion source, the radical source and the ECR source as described above, the radical density which is associated with the smoothness and the ion density which is associated with the etching rate can be controlled independently. For this reason, fast etching is possible while maintaining the smoothness on the etching surface. It also becomes easy to control the etching rate, the cross-sectional shape and the smoothness on the etching surface. When dry-etching is performed on InP with a mixed gas of chlorine and nitrogen with $SiO_2$ being used as a mask, since a P chloride is readily sublimated but a In chloride is not as described in Example 1, a layer of the In chloride is formed on the surface of the sample. In order to sublimate this In chloride layer, kinetic energy of accelerated chlorine ions and nitrogen ions can be used.

Accordingly, the flow rate of the chlorine ions is made larger than that of the chlorine radicals, and the chlorine ions and the nitrogen ions are accelerated by high voltage of about 300 V or greater, and then supplied. In order to have high etching rate, the temperature of the sample is set at about 150° C. or greater.

According to the present example, dry-etching on InP which results in a smooth etching surface can be performed under the following conditions: the chlorine radical flow rate from the radical beam source is about 1 SCCM or greater; the chlorine ion flow rate from the ion beam source is about 10 SCCM or greater; the accelerating voltage is about 300 V or greater; and the nitrogen ion flow rate from the ECR source is about 3 SCCM or less. Furthermore, dry-etching which results in a crosssection having vertical sides and in a smooth etching surface can be realized under the following conditions: the chlorine radical flow rate is about 1 SCCM; the chlorine ion flow rate is about 10 SCCM; the accelerating voltage for chlorine ions is about 600 V or greater; the nitrogen flow rate from the ECR source is about 3 SCCM; and the sample temperature is about 150° C.

(EXAMPLE 6)

Figure 10A:
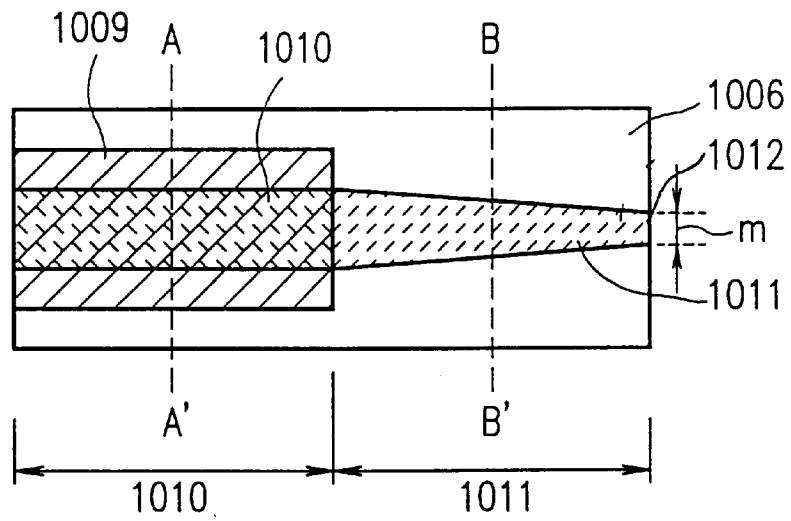
FIGS. 10A, 10B and 10C are cross-sectional views of a laser diode with mode size converter according to one embodiment of the present invention.
Figure 10B:
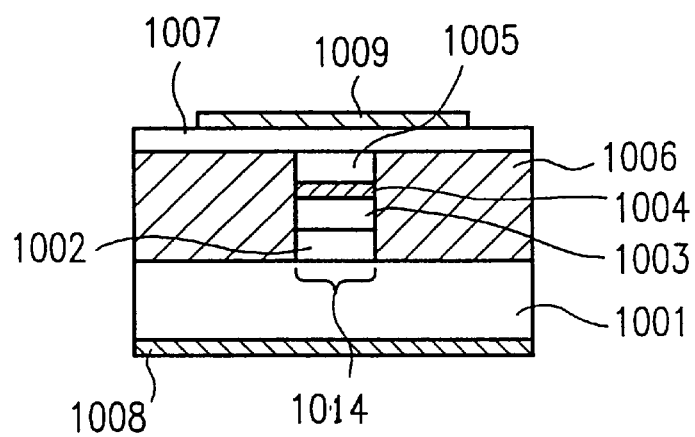
Figure 10C:
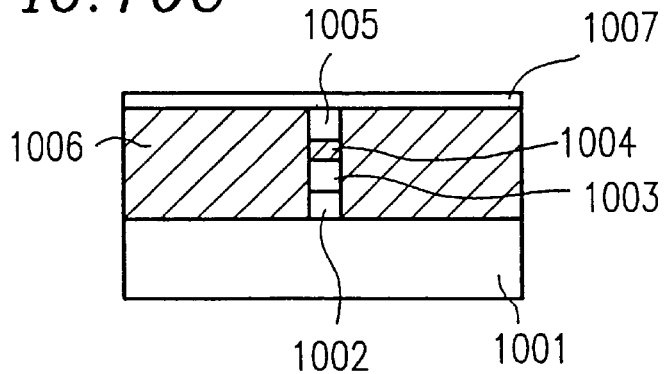

Hereinafter, a method for producing a semiconductor laser device using the etching method described in the above Examples 1 to 5 will be described. A laser diode with mode size converter will be described in this example. FIGS. 10A, 10B and 10C are cross-sectional views schematically illustrating a structure of the laser diode with mode size converter.

This laser diode with mode size converter includes a laser unit 1010 and a mode size converter unit 1011 (a tip portion) as shown in FIG. 10A. The laser unit 1010 has a stripe shape of a constant width and thickness. The mode size converter unit 1011 has a tapered shape whose width reduces into an emitting facet 1012. The spot radius (mode radius) of the laser light is converted from the spot radius of the laser unit 1010 to the radius m of the emitting facet 1012 (a tip of the tip portion 1011) as the laser light is guided through the mode size converter unit 1011. The emitting facet has a width m of about 1 $\mu$m or less (typically about 0.6 $\mu$m), and the angle of the cross-section is about 90° C.

FIG. 10B is a cross-section taken along a line A–A' in FIG. 10A. As illustrated in FIG. 10B, an n-InP layer 1002, an n-InGaAsP cladding layer 1003, an active layer 1004, a p-InGaAsP cladding layer 1005 and a p-InP cap layer 1007 are epitaxially grown in this order on an n-InP substrate 1001. These layers constitute a mesa stripe (a ridge stripe) 1014, which is buried in semi-insulating InP 1006. A p-side electrode 1009 is formed on the p-InP cap layer 1007, and an n-side electrode 1008 is formed on the entire rear surface of the substrate 1001.

Positive holes injected from the p-side electrode 1009 recombine with electrons injected from the n-side electrode 1008 in the active layer 1004. Generation of light occurs under the p-side electrode 1009, and the light thus generated is confined between the resonator end surfaces for laser oscillation.

FIG. 10C is a cross-section taken along a line B–B' in FIG. 10A. As can be seen from a comparison of FIGS. 10B and 10C, the width of the active layer 1004 differs for the laser unit 1010 and for the mode size converter unit 1011. That is, the width of the active layer 1004 is smaller for the mode size converter unit 1011.

Hereinafter, a method for producing a laser diode with mode size converter will be described with reference to FIGS. 11A to 11G. FIGS. 11A to 11G are cross-sectional views schematically illustrating the laser unit 1010. The mode size converter unit 1011 differs only in the width of the active layer, and is produced at the same time as the laser unit 1010.

Figure 11A:
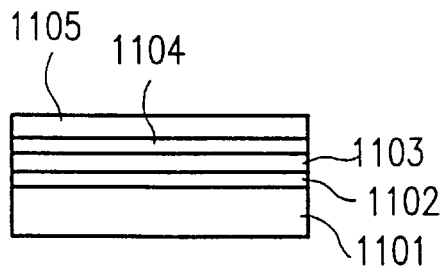
FIGS. 11A to 11G are cross-sectional views illustrating the production steps for the laser diode with mode size converter shown in FIGS. 10A, 10B and 10C.
Figure 11B:
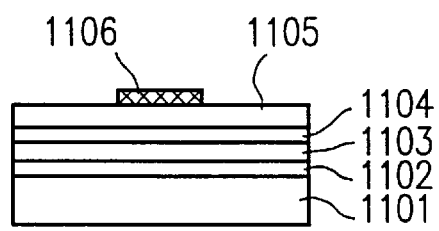

First, as illustrated in FIG. 11A, an n-InP layer 1102, an n-InGaAsP cladding layer 1103, an active layer 1104 and a p-InGaAsP cladding layer 1105 are grown in this order on an n-InP substrate 1101 by Metal Organic Vapor Phase Epitaxy (MOVPE). Then, as illustrated in FIG. 11B, an $SiO_2$ mask 1106 having a predetermined shape is formed on the p-InGaAsP cladding layer 1105.

Figure 11C:
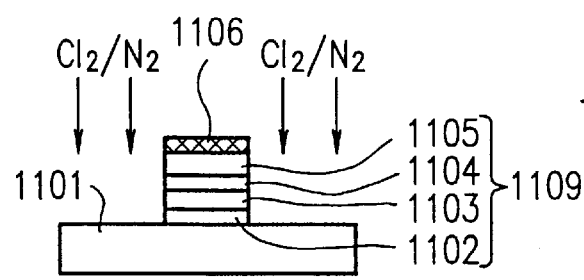
Figure 11D:
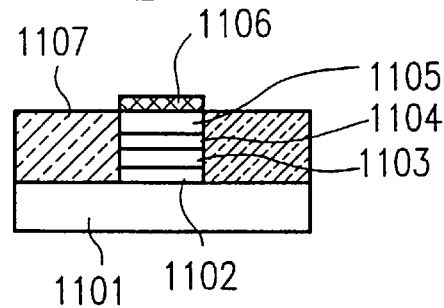
Figure 11E:
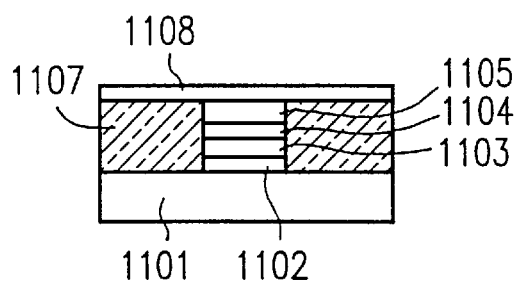
Figure 11F:
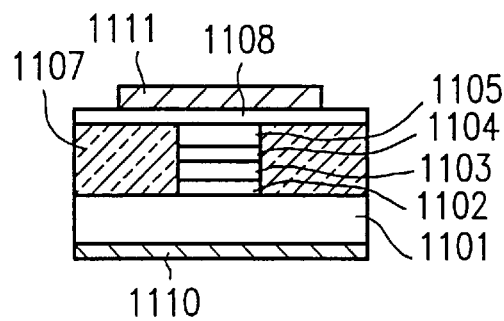
Figure 11G:
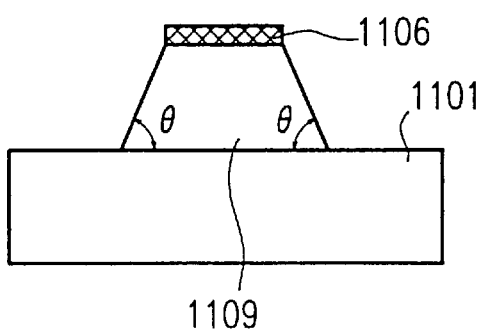

Next, as illustrated in FIG. 11C, a mesa stripe (ridge stripe) 1109 is formed by using a magnetic field type ECR-RIBE apparatus in any one of the etching methods described in Examples 1 to 5 above. Etching conditions are as follows: the chlorine/nitrogen flow rate ratio $\geq 1$; the microwave power is about 200 W; the internal pressure about 2 mTorr or greater; the sample temperature is about 150° C. or greater; and the acceleration voltage is about 300 V or greater. With the mesa stripe formed under these conditions, an angel $\theta$ formed by the side surface of the mesa stripe and the surface of the substrate 1101 as shown in FIG. 11G is in the range between about 60° and about 90°. Next, as shown in FIG. 11D, crystal growth is performed by MOVPE with the $SiO_2$ mask 1106 being used as a mask for selective growth, thereby burying the mesa stripe 1109 with the semi-insulating InP 1107. After removing the $SiO_2$ mask 1106, as illustrated in FIG. 11E, the p-InGaAsP cap layer 1108 is formed by MOVPE. Finally, as illustrated in FIG.

11F, the p-side electrode 1111 and the n-side electrode 1110 are deposited, and then heat treatment is performed so as to form ohmic contacts.

As described above, according to the present invention, by performing etching with the chlorine gas and the nitrogen gas in the ECR-RIBE apparatus, both the mesa stripe whose side forms an angle θ of about 60° to about 90° with the surface of the substrate 1101 and a cavity and waveguide having an emitting facet whose width is about 1 μm or less can be formed. According to the method of the present invention, an inverted mesa (the angle θ being greater than 90°) which reduces the reliability of the device can be avoided.

Although the laser diode is tapered such that the width of the tip portion is smaller than that of the laser unit in the above description, it should be appreciated that the width of the tip portion may be made larger than that of the laser unit.

Although an ECR-RIBE apparatus is used in the above embodiments, a dry-etching apparatus including an inductively coupled plasma source, a dry-etching apparatus including a helicon plasma source, or dry-etching apparatus including an NLD type plasma source can also be used.

Although the above embodiments are described with InP being used as a compound semiconductor, other III–V group or II–VI group compound semiconductors can also be used. Although chlorine gas is used in the above descriptions, gases including chlorine, bromine or iodine can also be used.

(EXAMPLE 7)

Hereinafter, a method for producing another semiconductor laser device, using any one of the etching methods described in above Examples 1 to 5, will be described with reference to FIGS. 13A to 13D. In the present embodiment, a compound semiconductor to be etched contains aluminum (Al).

Figure 13A:
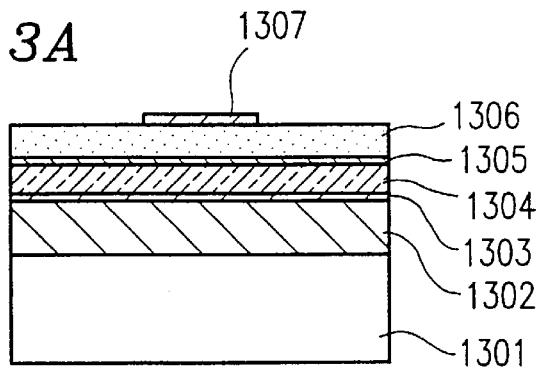
FIGS. 13A to 13D are cross-sectional views illustrating the production steps for a semiconductor laser according to one embodiment of the present invention.

First, as illustrated in FIG. 13A, an n-GaAs buffer layer (not shown in the figure), an n-$Al_xGa_yIn_{1-x-y}P$ ($0<x\leq1$, $0\leq y\leq1$; hereinafter, referred to as AlGaInP) cladding layer 1302, a multi-quantum well active layer 1303 made of an AlGaInP barrier layer and a GaInP well layer, a p-AlGaInP first cladding layer 1304, a GaInP etching stopper layer 1305 (thickness: about 5 nm) and a p-AlGaInP second cladding layer 1306 are epitaxially grown in this order on an n-GaAs substrate 1301 by MOVPE method. The GaAs substrate 1301 is an off-substrate which is tilted by about 10 degrees from a (100) surface in the [110] direction.

Next, in order to form a ridge, a patterned $SiO_2$ mask 1307 having a width of about 4 μm and a thickness of about 0.5 μm is formed on the p-AlGaInP layer 1306.

Figure 13B:
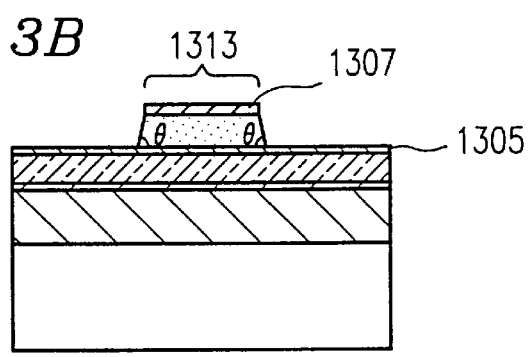

Next, as illustrated in FIG. 13B, by using any one of the etching methods described in the above Examples 1 to 5, a ridge 1313 is formed with the $SiO_2$ mask 1307 being used as an etching mask. As an etching condition, the flow rate is set at about 11 SCCM for chlorine and at about 3.5 SCCM for nitrogen so that the chlorine/nitrogen flow rate ratio becomes about 3.1. Other conditions are as follows: the acceleration voltage is about 650 V; the internal pressure is about 2.5 mTorr; and the sample temperature is about 100° C. By performing dry-etching under such conditions, a trapezoidal ridge 1313 which is horizontally symmetrical can be obtained.

Figure 14A:
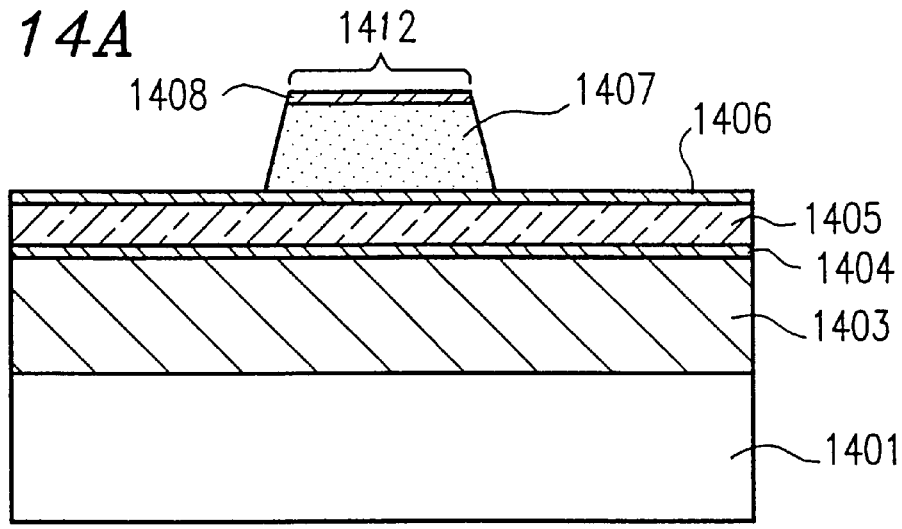
FIGS. 14A and 14B are cross-sectional views of a semiconductor laser for comparing ridge symmetry.
Figure 14B:
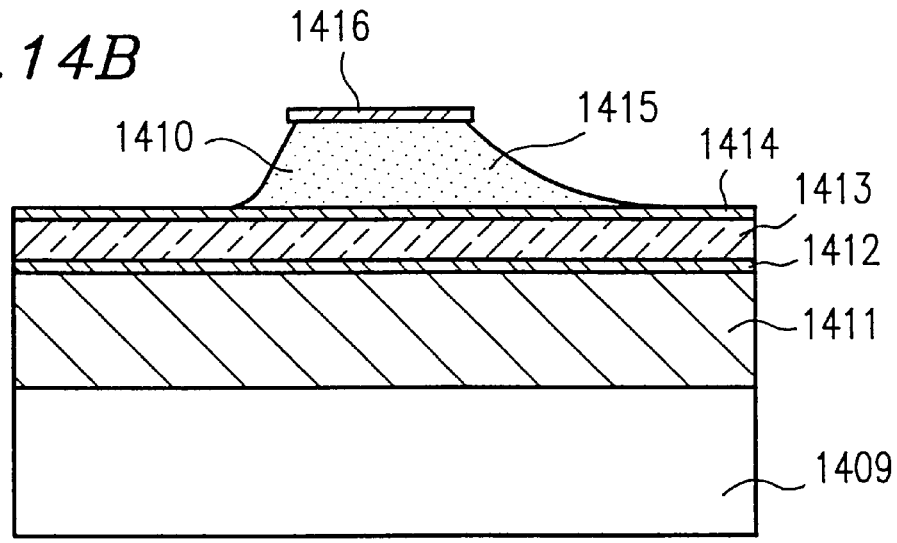

Typically, etching using a misoriented substrate does not make the ridge to be horizontally symmetrical as illustrated in FIG. 14B. Since the substrate is tilted from the (100) surface, in wet-etching using a sulfuric acid based etchant, the inclination of the side becomes small near the bottom of the ridge, and the ridge becomes asymmetrical in shape. As a result, the injection of carriers into the active layer and the optical confinement become non-uniform, and the transverse mode becomes unstable. This becomes particularly prominent when the laser is actuated at a high temperature.

Moreover, in an AlGaInP type semiconductor laser, in order to shorten the wavelength of laser light, the tilt angle is made larger and larger. According to the present embodiment, as illustrated in FIG. 14A, by performing dry-etching under the above conditions, the ridge 1412 which is symmetrical in shape can be formed even when an off-substrate is used.

As illustrated in FIG. 13B, the dry-etching for making the ridge is stopped at the etching stopper layer 1305. The thickness of the p-AlGaInP second cladding layer 1306 to be removed by the dry-etching is about 1.5 μm. Such a thick layer is first removed for about 1.3 μm by the first dry-etching which has strong sputtering components as described in Example 2, and then the remaining thickness of about 0.2 μm of p-AlGaInP is removed by the second dry-etching which has strong chemical reaction components. In this way, damage due to etching to the layers below the etching stopper layer 1305 can be avoided.

Alternatively, as described in Example 3, a thickness of about 1.3 μm of the second cladding layer 1306 can be removed by the dry-etching having strong sputtering components, and then the remaining thickness of about 0.2 μm of the second cladding layer 1306 can be removed by the wet-etching performed as the second etching.

Figure 13C:
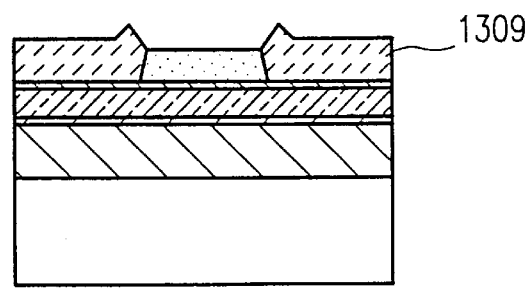

After forming the ridge 1313, as illustrated in FIG. 13C, an n-GaAs current blocking layer 1309 which serves as an n-type burying layer is selectively grown using the $SiO_2$ mask 1307, and then the $SiO_2$ mask 1307 is removed.

Figure 13D:
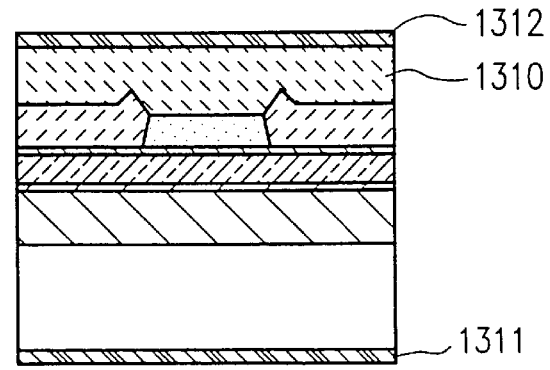

Next, as illustrated in FIG. 13D, a p-GaAs contact layer 1310 is grown. Finally, an n-side electrode 1311 is formed on the rear side of an n-GaAs substrate 1301, and a p-side electrode 1312 is formed on the contact layer 1310, thereby completing the laser structure.

In the method for producing a semiconductor laser device of the present embodiment, by setting the flow rate ratio of a halogen gas and a nitrogen gas in the range of about $1.4\leq$ chlorine flow rate/nitrogen flow rate $\geq$ about 4.0 when forming the ridge 1313, the angle θ formed with the bottom surface of the ridge 1313 and the side surface of the ridge 1313 can be made to be in the range of about 60 degrees to 90 degrees. It becomes also possible to produce a semiconductor laser device having a ridge shape with excellent symmetry even if an off-substrate is used. For this reason, the confinement of carriers in the active layer and the optical confinement do not become non-uniform, and a semiconductor laser having excellent reliability and stable transverse mode can be obtained. Furthermore, according to the present embodiment, although the etching is performed on a compound semiconductor containing Al, the etching rate does not decrease.

Figure 15A:
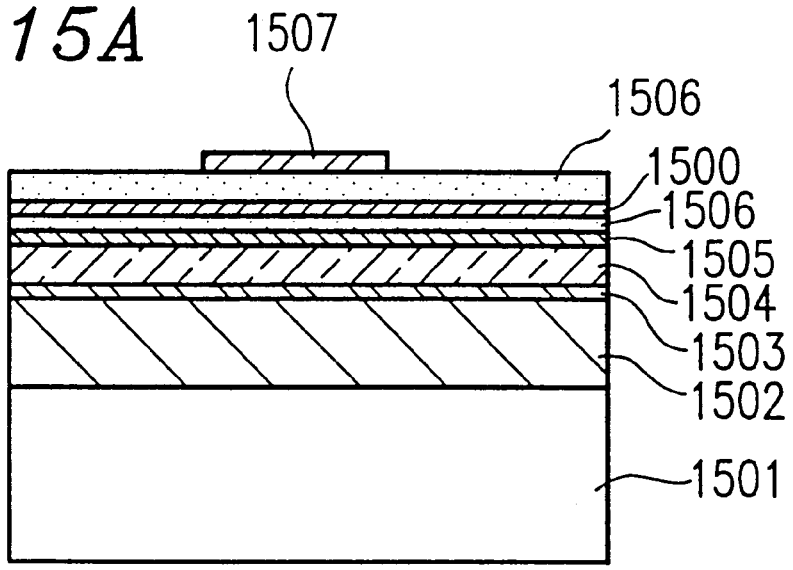
FIGS. 15A and 15B are cross-sectional views of a semiconductor laser including a layer monitoring an etching amount in the cladding layer.

In the above description, in the step of performing the dry-etching the p-AlGaInP second cladding layer, a thickness of about 1.3 μm of the AlGaInP cladding layer is removed by the first dry-etching, and then the conditions are changed and the second dry-etching is performed. In order to easily detect (monitor) that a thickness of about 1.3 μm of AlGaInP cladding layer has been removed, a GaInP layer 1500 (thickness: about 10 nm) may be inserted at the desired location in the second AlGaInP cladding layer 1506 before the etching as illustrated in FIG. 15A.

Figure 15B:
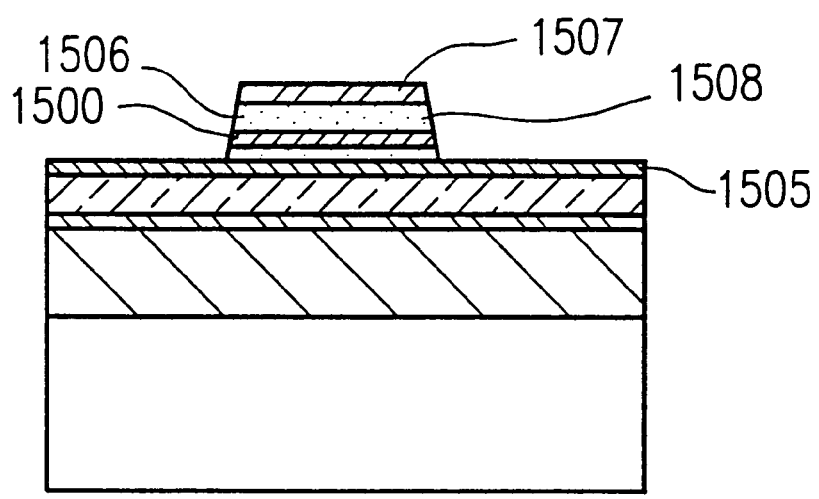

Assuming that the GaInP layer 1500 is included, if etching is performed on the AlGaInP second cladding layer while spectroscopic analysis of the plasma is being performed, then the value of spectroscopic analysis changes when the etching proceeds to the GaInP layer 1500. The reason is that the GaInP layer 1500 does not contain Al. This change makes it possible to accurately detect that a thickness of about 1.3 $\mu$m of the second cladding layer has been etched away. Then, the etching conditions can be changed for the second dry-etching as illustrated in FIG. 15B, and a remaining thickness of about 0.2 $\mu$m of the second cladding layer is etched away. This makes it possible to produce a semiconductor laser device which experiences less damage during etching and has excellent controllability and uniform characteristics.

According to the present embodiment, when Al is contained in the sample to be etched, even though $Al_2O_3$ is formed from residual moisture within the reaction chamber, the desorption of $Al_2O_3$ by sputtering can be facilitated by increasing the production amount of chlorine ions without decreasing the production amount of chlorine radicals. Moreover, the chlorine radicals react with Al so that desorption of Al in the form of aluminum chloride occurs. This eliminates a problem that the sample becomes unsusceptible to etching or the etching rate decreases.

According to the present invention, following effects are obtained.

By setting the chlorine/nitrogen flow rate ratio to be about 1 or greater and the internal pressure to be about 1 mTorr or greater, the dry-etching on a III–V group and II–VI group compound semiconductor which yields a smooth etching surface can be performed.

Moreover, by performing dry-etching, using a dry-etching apparatus including a radical source and an ion beam source, while independently controlling the chlorine ion density, the chlorine radical density and the nitrogen ion density, the dry-etching on a III–V group and II–VI group compound semiconductor which yields a smooth etching surface can be performed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed:

1. An etching method for performing dry-etching on a III–V compound semiconductor or a II–VI group compound semiconductor in a dry-etching apparatus comprising a plasma source for creating a plasma with density of about $10^{10}$ cm$^{-3}$ or greater, using a mixed gas containing a gas including a halogen element and a gas including nitrogen and using an acceleration voltage of about 300 V or more, wherein:

(a flow rate of the gas containing said halogen gas)/(a flow rate of said nitrogen gas)$\geq$about 1; and a process pressure during etching reaction is about 1 mTorr or greater.

2. An etching method according to claim 1, wherein ions created in said plasma source are accelerated, and a sample is etched by kinetic energy of said accelerated ions while a sample surface is being heated.

3. An etching method according to claim 1, wherein: ions created in said plasma source are accclerated; only a portion of the sample containing a II–VI group compound in the vicinity of the surface is heated by kinetic energy of said accelerated ions; and a support for said sample is cooled.

4. An etching method according to claim 1, wherein etching is performed while a sample holder is heated.

5. An etching method according to claim 1, further comprising the steps of:

performing a first dry-etching wherein ions created in said plasma source are accelerated by a first accelerating voltage;

performing a second dry-etching, after said first dry-etching, wherein ions created in said plasma source are accelerated by a second accelerating voltage; wherein said second accelerating voltage is larger than said first accelerating voltage.

6. An etching method according to claim 1, further including a step of performing wet-etching.

7. An etching method according to claim 1, wherein said dry-etching apparatus comprises a radical beam source and an ion beam source, and a density of radicals created in said radical beam source and a density of ions created in said ion beam source are independently controlled.

8. An etching method according to claim 1, wherein said compound semiconductor is formed of $Al_xGa_yIn_{1-x-y}P$ ($0<x\leq 1$, $0\leq y\leq 1$).

9. An etching method according to claim 8, wherein said compound semiconductor is formed above an off-substrate.

10. An etching method for performing dry-etching on a III–V group compound semiconductor or a II–VI group compound semiconductor in a dry-etching apparatus comprising a plasma source for creating a plasma with density of about $10^{10}$ cm$^{-3}$ or greater, using a mixed gas containing a gas including halogen element and a gas including nitrogen, comprising the steps of:

performing a first dry etching with a halogen ion density being made larger than a halogen radical density; and performing a second dry-etching within a halogen ion density being made smaller than a halogen radical density.

11. An etching method for performing dry-etching on a III–V compound semiconductor in a dry-etching apparatus comprising a plasma source for creating a plasma with density of about $10^{10}$ cm$^{-3}$ or greater, using a mixed gas containing a gas including a halogen element and a gas including nitrogen and using an acceleration voltage of about 300 V or more, wherein:

(a flow rate of the gas containing said halogen gas)/(a flow rate of said nitrogen gas)$\geq$about 1; and a process pressure during etching reaction is about 1 mTorr or greater.

12. The etching method according to claim 11, wherein ions created in said plasma source are accelerated, and a sample is etched by kinetic energy of said accelerated ions while a sample surface is being heated.

13. The etching method according to claim 11, wherein etching is performed while a sample holder is heated.

14. The etching method according to claim 11, further including a step of performing wet-etching.

15. The etching method according to claim 11, wherein said dry-etching apparatus comprises a radical beam source and an ion beam source, and a density of radicals created in said radical beam source and a density of ions created in said ion beam source are independently controlled.

16. The etching method according to claim 11, wherein said compound semiconductor is formed of $AlxGayIn_{1-x-y}P$ ($0<x\leq 1$, $0\leq y\leq 1$).

17. The etching method according to claim 16, wherein said compound semiconductor is formed above an off-substrate.

* * * * *